United States Patent [19]
Haberland et al.

[11] 3,774,084
[45] Nov. 20, 1973

[54] ELECTRONIC SWITCH

[75] Inventors: Detlef Haberland, Munich; Dieter Schuocker, Wine/Osterreich, both of Germany

[73] Assignee: Siemens Aktiengesellschaft, Berlin, Germany

[22] Filed: Mar. 8, 1972

[21] Appl. No.: 232,867

[30] Foreign Application Priority Data

Mar. 12, 1971 Germany .................. P 21 12 069.4

[52] U.S. Cl. .......................... 317/234 R, 317/234 V
[51] Int. Cl. .............................................. H011 5/02
[58] Field of Search ..................................... 317/234

[56] References Cited

UNITED STATES PATENTS

| | | | |
|---|---|---|---|
| 3,271,591 | 9/1966 | Ovshinsky | 307/88.5 |
| 3,629,155 | 12/1971 | Kristensen | 252/512 |
| 3,395,446 | 8/1968 | Jensen | 29/577 |
| 3,436,624 | 4/1969 | Wesemeyer | 317/237 |

*Primary Examiner*—John W. Huckert
*Assistant Examiner*—E. Wojciechowicz
*Attorney*—William E. Schuyler

[57] ABSTRACT

An electronic switching element made of vitreous semiconductor materials is described. The switch changes from high to low conductivity or vice versa without changing its state of matter. A plurality of contact electrodes is disposed thereon, and no barrier layer is present. In order to switch from a low conductive to a high conductive state, a highly conductive channel is produced intermediate a control electrode and a base electrode by a control current flowing over the control electrode and the base electrodes. The aforementioned channel expands when the control current increases. Upon a sufficient increase in the size of the channel in the direction of a load electrode, a channel of large conductivity is produced connecting the load electrode and the base electrode over which a load current can proceed. This load current channel is maintained upon interruption of the control current, until, by lowering the auxiliary voltage under a predetermined value, the high conductive state is switched to a low conductive state. The load current is then interrupted.

9 Claims, 4 Drawing Figures

PATENTED NOV 20 1973 3,774,084

ELECTRONIC SWITCH

BACKGROUND OF THE INVENTION:

Two-pole electronic switches from vitreous semiconductor material are known in the art (see e.g., U.S. Pat. No. 3,343,004, West German Patent Publication Display Copy 1,261,252, West German Patent Application No. 1,933,831). Such semiconductor material can consist of different elements of the fourth, fifth, and sixth group of the periodic system of elements, such as, for example, lead, phosphorus, arsenic, antimony, sulfur, selenium, tellurium, germanium, silicon and other less common elements. As is known, such semiconductor material can be switched from a state of small conductivity to a state of great conductivity and vice versa. To use it in an electronic switch, the semiconductor material is provided with a plurality of contact electrodes which are placed on the semiconductor material free of barrier layer. This results, for example, in an electronic switch wherein, upon application of a voltage, a path of higher temperature and, therewith, of great electric conductivity can be formed (see e.g., West German Patent Publication 1,465,450). It is also known to combine a plurality of this type of electronic switches in a single semiconductor body (see e.g., West German Patent Publications 1,263,079 and 1,464,880), wherein the individual switch sections are operated independently and do not influence one another, aside from the fact that they have a common electrode. It is, likewise, known to provide in this type of electronic switch two pairs of contact electrodes. A pair of the electrodes is constructed to supply a control current, through which the switch section lying between the other pair of electrodes is controlled (see West German Patent Application 1,465,470).

The current, flowing via the controlled switch section is interrupted by means of a direct voltage control signal which is supplied to the control electrodes. This interruption continues even after the termination of the direct voltage signal. Hence, this electronic switch also functions as a storage element. Another similarly constructed storage element is known (see "Applied Physics Letters," Volume 15, No. 10, pp. 323 to 325, Nov. 15, 1969), wherein opposite electrodes can be provided in an arrangement other than pairs, i.e., in this storage element the control function and the storage function can also be performed by means of three electrodes in a side-by-side relation.

A closer examination of the processes taking place in the vitreous semiconductor material under study, when its electrical conductivity is changed, has shown that the storage effect connected therewith is related to a change of the state of matter of the semiconductor material (see "Nachrichtentechnische Zeitschrift" 1970, No. 9, pp. 449 to 455). As pointed out hereinabove, when, upon application of a voltage, a path of higher temperature and, therewith, of great electric conductivity is formed. Further, the state of matter is changed, since melting takes place which, upon interruption of the current, can be followed by crystallization, and this continues to impart a great conductivity to the switch section.

It has also been demonstrated that, in addition to the processes connected with the storage effect, also a reversible switch effect can occur which is not connected with any change of the state of manner. This effect can, likewise, be utilized for the operation of an electronic two-pole switch. However, the state of great conductivity is maintained only as long as there flows a certain minimum current. This type of electronic switch, therefore, differs from another connecting-through storage element of known construction (see West German Patent Application No. 1,549,077), wherein, though no change of the state of matter takes place during the operation, there nevertheless occurs with increasing voltage first a very small, then a very large, and finally again a very small electric conductivity.

SUMMARY OF THE INVENTION

The invention described herein provides an electronic switch constructed from vitreous semiconductor materials which can be switched from a state of low conductivity to a state of high conductivity, and vice versa, without altering its physical condition. In such an electronic switch a plurality of contact electrodes are disposed on the semi-conductor material having no depletion layer. As is known from the prior art discussed herein-above, a technique for producing such an electronic switch is to create an area of great conductivity between a control electrode and a base electrode by a control current flowing between the control electrode and the base electrode through the semi-conductor material. An auxiliary voltage applied to a load electrode and a base electrode, which in and of itself does not produce a conductive area separately, acts in conjunction with the control current to produce an area of great conductivity connecting the load electrode and the base electrode for conduction of a load current through the semiconductor material between the load electrode and the base electrode. This area of greater conductivity is maintained upon the interruption of the control current until one switches from a state of greater conductivity to a state of lower conductivity, by lowering the auxiliary voltage to a predetermined level. At that point, the load current is interrupted.

In accordance with the invention the base electrode is separated from control and load electrodes by the semi-conductor material. The load electrode is generally annular in shape and surrounds the control electrode. The channel of greater conductivity through the semi-conductor material, between the control electrode and the base electrode, expands in width as the control current is increased. Upon expanding sufficiently in the direction of the load electrode, the area of greater conductivity causes the load current to be switched on.

The aforementioned arrangement of the load electrode with respect to the control electrode yields the effect that the channel of greater conductivity is caused to expand physically only in the direction of the load electrode, when the control current is increased. At the same time this arrangement prevents the possibility that the channel of greater conductivity will expand physically in a direction other than in the direction of the load electrode. If the latter type of expansion were to occur, the channel of greater conductivity would have no effect on the switching process of the semi-conductor.

A further advantage lies in this structural arrangement of electrodes in that the channel of greater conductivity generates heat within the semi-conductor material, and this heat, so generated, has the effect of facilitating the construction and expansion of the channel of greater conductivity. This enhancement of the production of this channel is more pronounced within the area of the annular load electrode, because if it is produced within this area, the heat must be dissipated in the direction of the annular electrode, thereby avoiding dissipation of the heat somewhere outside of the area of the load electrode.

A further advantage of this construction is that, first, the channel of greater conductivity connecting the control electrode and the base electrode is produced, and only thereafter, when the control current is increased and the channel is expanded in size, is the load current switched on. The control circuit is then of a low impedance prior to the switching on of a load current. After the load current is switched on, only comparatively small voltages and current changes take place in the control circuit. Hence, at the moment of switching on the load current, the control circuit has a very low differential impedance. This produces the effect that only a small amount of power is required for switching on the load current.

The surrounding of the control electrode with the load electrode may also be utilized for shielding the control electrode from electrical interference. It then is easier to provide the control electrode with a particularly small capacitence, should this be of importance.

BRIEF DESCRIPTION OF THE INVENTION

For a better understanding of the principles of the invention, reference is had to the description and the accompanying drawings forming a part of this application wherein a preferred embodiment of an electronic switch according to these principles is shown.

DETAILED DESCRIPTION OF THE DRAWINGS

Figure 1:
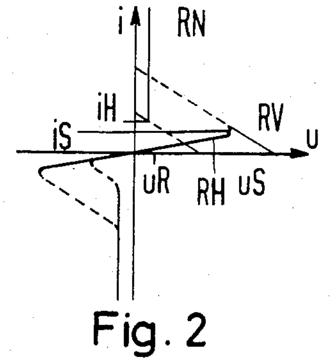
FIG. 1 shows a diagrammatic representation of the current/voltage characteristics for the reversible switching effect in vitreous semiconductor material utilized in accordance with the principles of the invention.

As mentioned hereinabove, a two-pole electronic switch from vitreous semiconductor material is the basis for the invention. This type of electronic switch can, for example, be constructed in the form of a thin-film element. FIG. 1 shows a diagrammatic representation of the current/voltage features for the reversible switching effect. Following the curve branch RH of the characteristic curve *u-i* in the direction of the larger current *i*, a threshold voltage *us*, and a threshold current *is*, are reached. When this threshold value is exceeded, the resistance of the switch, after running along the area of negative resistance, jumps to a value determined by the current limiting resistor R*v* connected in series with the switch. The residual voltage *ur* remains constant in this state. Now, as long as a specific holding current *i*H is not underrun, the switch continues to have a low resistance. When the holding current *i*H is underrun, the resistance jumps reversibly back to its original high value RH. This switching back takes place when *i*H is underrun independently from the current drop rate. Thus, no current-independent storage effect is available. The same switching-back relationship is also apparent when the switch is operated with a current going in another direction, as can be seen from the current/voltage characteristics shown in FIG. 1. Thus, the switch in question is two-directional and can, therefore, also be operated with a direct current.

According to the invention, this type of two-pole electronic switch can be constructed such that an additional contact electrode is provided, viz., a control electrode.

Figure 2:
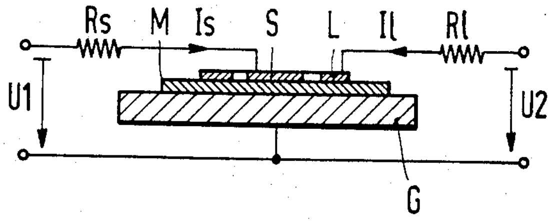
FIG. 2 is a schematic representation of the electronic switch in accordance with the invention, wherein three contact electrodes are provided.

FIG. 2 shows a cross section of such a switch. The thin layer M, of a vitreous semiconductor material, is placed on a base plate serving as a base electrode G, and a control electrode S and load electrode L are disposed thereupon. Control electrode S is surrounded annularly by load electrode L. The base electrode is separated by the semiconductor material and mounted opposite the two other contact elec-trodes. By means of voltage U1, a control current Is flowing via control electrode S and base electrode L can be generated via resistor Rs. Moreover, the auxiliary voltage U2 is applied on load electrode L and base electrode G via load resistor R1. Auxiliary voltage U2 is smaller than threshold voltage us, but larger or equal to holding voltage uR. Hence, the semiconductor material is not switched to the state of great conductivity due to the influence of the auxiliary voltage alone. However, auxiliary voltage U2 has such a polarity that it otherwise functions as a control current Is generated by the voltage U1.

To switch from the state of small conductivity to the state of large conductivity, a channel of large conductivity is first produced between control electrode S and base electrode G by a control current Is flowing via these two contact electrodes, for which voltage U1 shall be made sufficiently large. It is demonstrated that this channel expands spatially when the control current increases, and that upon sufficient widening thereof in the direction of load electrode L and under the influence of the applied auxiliary voltage U2, a channel of great conductivity is generated connecting load electrode L and base electrode G, so that a load current I*l* can now flow via load electrode L and base electrode G. This load current is essentially limited by load resistor R1. This load current I*l* is maintained even when the control current is interrupted. It is not interrupted until, by lowering auxiliary voltage U2, the state of great conductivity is switched to the state of small conductivity. Thus, in the electronic switch shown in FIG. 2, load current I*l* for a specific current circuit can be switched in by means of a control current I*s*, independent therefrom.

Closer investigations into the production and origin of the channel of great conductivity mentioned hereinabove demonstrate that for this in each case charge carriers are captured in the semiconductor material. The presence of the charge carriers is then assured by maintaining a characteristic minimum current density. Accordingly, a channel is in each case maintained by the retention of this characteristic minimum current density. Thus, in each case charge carriers first captured and then carried away again are constantly replaced. In the switch, in accordance with the invention, the minimum current density is attained first in the channel generated by the control current between control electrode S and base electrode G. When the control current increases, the channel widens, since the current density remains essentially the same. When the channel expands in the area lying between load electrode L and base electrode G, the load current rises erratically. This takes place when the control current has reached the strength required for completing the load current circuit. Prior thereto, the current in the load circuit increases insignificantly. The semiconductor material lying in the load current circuit keeps its great conductivity as long as the characteristic minimum current density there is maintained. Not until this is underrun, e.g., by sufficiently lowering or disconnecting the auxiliary voltage, is the semiconductor material switched to the state of small conductivity.

To avoid unintended storage effects, the change of the state of matter in all these processes is avoided. This can, for example, be effected by providing adequate heat dissipation, e.g., via the base electrode constructed as a metal plate. Accumulations of heat which could change the state of matter can be avoided by interrupting the load current by sufficiently long pauses, during which the heat generated theretofore is removed. Since the switching effect provided in the switch according to the invention is not connected with a change of the state of matter, it also follows that the switching process requires only comparatively little time, so that also the operation of the electronic switch with alternate current is made easier. The switching process causing the switch to be connected through can be shortened by increasing the control current.

By dividing contact electrodes into a plurality of part electrodes, the electronic switch in accordance with the invention can be developed further.

Figure 3:
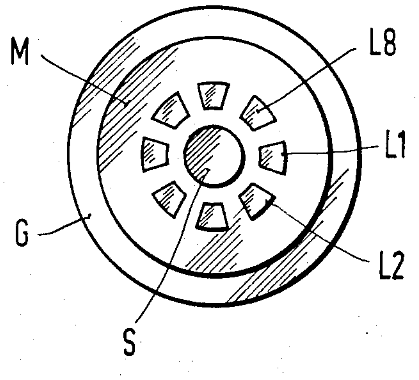
FIG. 3 is a top view of an alternate arrangement for the FIG. 2 embodiment.

FIG. 3 shows how the load electrode can be divided into a plurality of part electrodes. FIG. 3 is a top view of the electronic switch illustrated in FIG. 2. Accordingly, here, too, on the base electrode G which serves as a base plate, is a layer M of semiconductor material on which circular control electrodes S is located. Control electrode S is annularly surrounded by a plurality of load electrodes L1, L2 . . . L8 forming a plurality of ring sectors. By means of a control current flowing via control electrode S and base electrode G, a plurality of load current circuits can now be controlled over which, for example, different load currents can flow instead of one.

Figure 4:
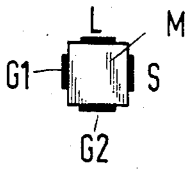
FIG. 4 is a schematic representation of a further preferred embodiment of the invention.

FIG. 4 shows an example of an electronic switch, wherein the base electrode is divided into two parts, one part (G1) located opposite control electrode S and the other part (G2) opposite load electrode L, the semiconductor material M in each case lying therebetween. In each case, the contact electrodes lie on the sides of a right parallel piped from the semiconductor material M. By means of a control current flowing between control electrode S and base electrode G1, here, too, a channel of great conductivity can be generated, which lies between load electrode L and base electrode G2, so that a load current flowing via these two contact electrodes can be switched in. For the rest, this electronic switch can be operated in the same manner as the other switches described hereinabove.

Finally, it is also possible to divide the control electrode in a plurality of part electrodes, thus, enabling the construction of a multiple control.

The elements discussed in detail hereinabove can also be considered as component parts of the vitreous semiconductor material for the electronic switch in accordance with the invention. A semiconductor material consisting of 70 percent by weight Te, 15 percent by weight As, 5 percent by weight Ge and 10 percent by weight Si has proved to be particularly suited for an electronic switch produced in thin-film technique.

Although certain preferred embodiments of the invention have been disclosed for purposes of illustration, it will be evident that various changes and modifications may be made therein without departing from the scope and spirit of the invention.

We claim:

1. An electronic switch constructed from vitreous semiconductor material capable of being switched between high and low conductive states, comprising:

a plurality of contact electrodes disposed on said semi-conductor material including at least a control electrode, a base electrode and a load electrode, said load electrode surrounding said control electrode, said base electrode being separated from said load and control electrodes by said semiconductor material;

means for applying a control current between said control electrode and said base electrode, a first current path between said control electrode and said base electrode in said semi-conductor material, said first current path being established upon application of said control current, the spatial dimensions of said first current path being proportional to the magnitude of said control current and expanding in the direction of said load electrode with increasing control current;

means for applying said auxiliary voltage between said load electrode and said base electrode and a second current path between said load electrode and said base electrode in said semi-conductor material, said second current path being established responsive to said first current path reaching a predetermined proximity to said load electrode and upon application of said auxiliary voltage, said second current path being maintained in the absence of said control voltage and interrupted by lowering said auxiliary voltage below a predetermined level, said semi-conductor material being changed from high conductivity to low conductivity upon interruption of said load current path.

2. The electronic switch defined in claim 1 wherein said first current path is produced by captured charge carriers in said semiconductor material and is maintained by retension of a minimum current density.

3. The electronic switch defined in claim 1 further comprising:

heat dissipation means for preventing a change in state of matter of said semiconductor material.

4. The electronic switch defined in claim 1 further comprising:

means for interrupting said load current for brief intervals to prevent a change in state of said semiconductor material.

5. The electronic switch defined in claim 1 wherein said load electrode is divided into a plurality of portions.

6. The electronic switch defined in claim 1 wherein said control electrode is divided into a plurality of portions.

7. The electronic switch defined in claim 1 wherein said base electrode is divided into a plurality of portions.

8. The electronic switch defined in claim 1 wherein said load electrode is annularly-shaped.

9. The electronic switch defined in claim 5 wherein said control electrode is surrounded by said load electrode portions, which are arranged annularly around said control electrode forming a plurality of ring sectors.

* * * * *